United States Patent
Jeong

(10) Patent No.: US 8,399,877 B2
(45) Date of Patent: Mar. 19, 2013

(54) LIGHT EMITTING DEVICE, METHOD FOR FABRICATING LIGHT EMITTING DEVICE, LIGHT EMITTING DEVICE PACKAGE, AND LIGHTING SYSTEM

(75) Inventor: Jongpil Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 87 days.

(21) Appl. No.: 13/164,471

(22) Filed: Jun. 20, 2011

(65) Prior Publication Data

US 2011/0309327 A1    Dec. 22, 2011

(30) Foreign Application Priority Data

Jun. 21, 2010 (KR) .................. 10-2010-0058781

(51) Int. Cl.
*H01L 33/04* (2010.01)
(52) U.S. Cl. ............ 257/13; 257/22; 257/E33.008
(58) Field of Classification Search ............ 257/13, 257/E33.008, 22
See application file for complete search history.

(56) References Cited

U.S. PATENT DOCUMENTS

| | | | |
|---|---|---|---|
| 2003/0209704 A1* | 11/2003 | Yamada ................. | 257/14 |
| 2009/0057691 A1* | 3/2009 | Kim et al. ............. | 257/89 |
| 2011/0212560 A1* | 9/2011 | Sumitomo et al. ..... | 438/47 |
| 2012/0153259 A1* | 6/2012 | Lee et al. .............. | 257/13 |

* cited by examiner

*Primary Examiner* — Long Pham
(74) *Attorney, Agent, or Firm* — Birch, Stewart, Kolasch & Birch, LLP

(57) ABSTRACT

A light emitting device is provided. The light emitting device includes a first conductivity type semiconductor layer, a second conductivity type semiconductor layer, an active layer disposed between the first conductivity type semiconductor layer and the second conductivity type semiconductor layer and comprising a plurality of well layers and a plurality of barrier layers, a first nitride semiconductor layer disposed between the first conductivity type semiconductor layer and the active layer, and a second nitride semiconductor layer disposed between the active layer and the second conductivity type semiconductor layer, wherein the first nitride semiconductor layer has a higher indium composition than that of at least one of the plurality of well layers.

20 Claims, 8 Drawing Sheets

LIGHT EMITTING DEVICE, METHOD FOR FABRICATING LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. §119(a) of Korean Patent Application No. 10-2010-0058781 filed on Jun. 21, 2010, which is hereby incorporated by reference in its entirety.

BACKGROUND

The present disclosure relates to a light emitting device.

A group III-V nitride semiconductor is drawing much attention as a main material of a light emitting device such as a light emitting diode (LED) or a laser diode (LD) due to its physical and chemical characteristics. The group III-V nitride semiconductor is formed of a semiconductor material having a composition formula represented by $In_xAl_yGa_{1-x-y}N$ ($0 \leq x \leq 1$, $0 \leq y \leq 1$, $0 \leq x+y \leq 1$) in general.

A light emitting diode (LED) is one type of semiconductor device that is used as a light source or receives or transmits a signal by converting electricity into infrared rays or light using the characteristics of a compound semiconductor.

An LED or an LD, adopting such a nitride semiconductor material, is used in a light emitting device for obtaining light, and is being applied as a light source of various types of products such as a keypad light emitting part of a cellular phone, an electronic display, a lighting apparatus, and the like.

SUMMARY

Embodiments provide a light emitting device having a noble active layer structure, a method for fabricating the light emitting device, a light emitting device package, and a lighting system.

Embodiments provide a light emitting device to reduce leakage current, a method for fabricating the light emitting device, a light emitting device package and a lighting system.

Embodiments provide a light emitting device with improved light emitting characteristics, a method for fabricating the light emitting device, a light emitting device package, and a lighting system.

In one embodiment, a light emitting device comprises: a first conductivity type semiconductor layer; a second conductivity type semiconductor layer; an active layer disposed between the first conductivity type semiconductor layer and the second conductivity type semiconductor layer and including a plurality of well layers and a plurality of barrier layers; a first nitride semiconductor layer disposed between the first conductivity type semiconductor layer and the active layer; and a second nitride semiconductor layer disposed between the active layer and the second conductivity type semiconductor layer, wherein the first nitride semiconductor layer has a higher indium composition than that of at least one of the plurality of well layers.

In another embodiment, a light emitting device includes: a first conductivity type semiconductor layer; a second conductivity type semiconductor layer; an active layer disposed between the first conductivity type semiconductor layer and the second conductivity type semiconductor layer, and including a plurality of well layers and a plurality of barrier layers; a first nitride semiconductor layer disposed between the first conductivity type semiconductor layer and the active layer; and a second nitride semiconductor layer disposed between the active layer and the second conductivity type semiconductor layer, wherein the first nitride semiconductor layer includes an InGaN-based compound semiconductor layer, the second nitride semiconductor layer includes an AlGaN-based compound semiconductor layer, the active layer includes a plurality of pits, and an upper surface of the second nitride semiconductor layer is spaced apart from the plurality of pits.

In further another embodiment, a light emitting device includes: a first conductivity type semiconductor layer; a second conductivity type semiconductor layer; an active layer disposed between the first conductivity type semiconductor layer and the second conductivity type semiconductor layer, and including a plurality of well layers and a plurality of barrier layers; a first nitride semiconductor layer disposed between the first conductivity type semiconductor layer and the active layer; and a second nitride semiconductor layer disposed between the active layer and the second conductivity type semiconductor layer, wherein the first nitride semiconductor layer has first conductivity type impurities and includes a semiconductor layer different from the first conductivity type semiconductor layer, the second nitride semiconductor layer has second conductivity type impurities and includes a semiconductor layer different from the second conductivity type semiconductor layer, the active layer includes a plurality of pits therein, and the first nitride semiconductor layer includes a plurality of indium clusters and a plurality of dislocations.

The details of one or more embodiments are set forth in the accompanying drawings and the description below. Other features will be apparent from the description and drawings, and from the claims.

DETAILED DESCRIPTION OF THE EMBODIMENTS

Figure 1:
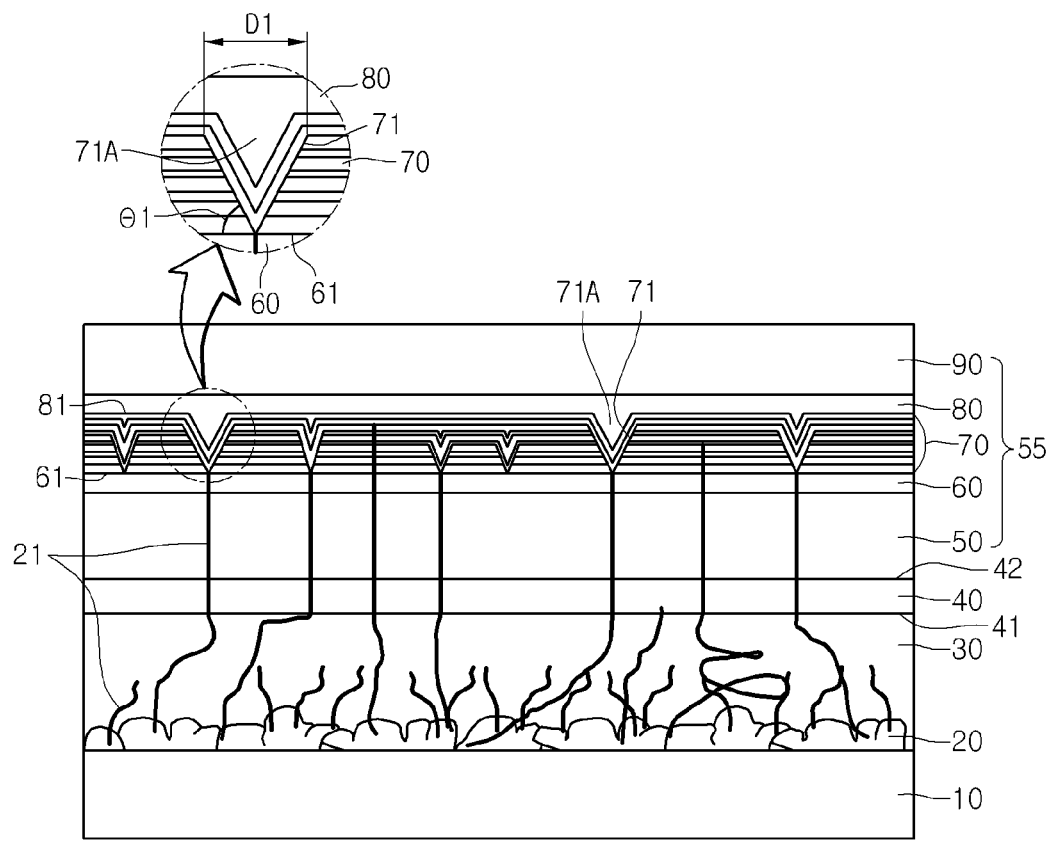
FIG. 1 is a side sectional view illustrating a light emitting device according to an embodiment.

Reference will now be made in detail to the embodiments of the present disclosure, examples of which are illustrated in the accompanying drawings.

In the following description, it will be understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, and one or more intervening layers may also be present. In the description of embodiments, it will be understood that when a layer is referred to as being 'on' or 'under' another layer, the reference about 'on' and 'under' each layer will be made on the basis of drawings.

In the drawings, the thicknesses and sizes of layers are exaggerated or schematically illustrated for clarity. The size of each constituent in the drawings does not totally reflect the actual size thereof.

FIG. 1 is a view for describing a light emitting device and a method for fabricating the light emitting device according to an embodiment.

FIG. 1 is a view illustrating in detail a buffer layer, dislocations, pits in a light emitting device according to embodiments, and the pits are illustrated in slightly exaggerated fashion for the ease of understanding.

Referring to FIG. 1, a light emitting device includes a substrate 10, a buffer layer 20, a first semiconductor layer 30, a second semiconductor layer 40, a first conductivity type semiconductor layer 50, a first nitride semiconductor layer 60, an active layer 70, a second nitride semiconductor layer 80, and a second conductivity type semiconductor layer 90.

The substrate 10 may include at least one of transparent, insulting and conductive properties. The substrate 10 may be formed of at least one of sapphire ($Al_2O_3$), SiC, GaAs, GaN, ZnO, Si, GaP, TnP, and Ge, for example, but is not limited thereto. A light extraction structure such as an uneven pattern may be formed on the upper or lower surface of the substrate 10. The uneven pattern may be provided in a stripe shape, a lens shape, a column shape, a horn shape or the like. The light extraction structure includes a protruding pattern with respect to the flat upper surface, or a concave pattern with respect to the flat lower surface of the substrate 10.

The buffer layer 20 is formed on the substrate 10 and serves to reduce the difference in lattice constant with respect to a semiconductor layer grown on the substrate 10. The buffer layer 20 may be formed of a material having a composition formula represented by $Al_xIn_yGa_{1-x-y}N$ ($0 \leq y \leq 1$, $0 \leq x+y \leq 1$) for example. The buffer layer 20 may be formed as an AlN layer. As another example, the buffer layer 20, although not limited thereto, may be formed as a compound semiconductor layer of group II to VI elements. The buffer layer 20 may have a thickness ranging from 3 nm to 150 nm.

Dislocations 21 are generated in the buffer layer 20 due to lattice mismatch with respect to the substrate 10. The density of the dislocations 21 at the upper surface of the buffer layer 20 may be greater than that of another semiconductor layer.

The first semiconductor layer 30 is formed on the buffer layer 20, and includes a GaN-based semiconductor layer. For example, the first semiconductor layer 30 may be formed as an undoped GaN layer. The first semiconductor layer 30 is grown to have a thickness ranging from about 0.5 μm to 2 μm. Also, the first semiconductor layer 30, although not subjected to intentional doping, has a dopant concentration which is lower than that of the first conductivity type semiconductor layer 50, and may have a lower level of electricity conductivity than that of the first conductivity type semiconductor layer 50. The dislocations 21 propagate in the first semiconductor layer 30. The dislocations 21 may propagate vertically with respect to the lower surface of the substrate 10, and some dislocations may propagate in a horizontal, tilted or vertical direction. Here, the vertical direction may be the thickness direction of the first semiconductor layer 30, and the horizontal direction may be perpendicular to the vertical direction.

The second semiconductor layer 40 is formed on the first semiconductor layer 30, and may be formed of, for example, a GaN-based layer. The second semiconductor layer 40 is grown to have a thickness ranging from about 500 Å to 3000 Å. The second semiconductor layer 40 acts as a dislocation blocking layer blocking the extension of the dislocations 21. For the dislocation blocking, the second semiconductor layer 40 may be grown at a low temperature or have a superlattice structure. The superlattice structure is formed by repeating a pair of first and second layers at least two times, and the first layer and the second layer may be formed as different semiconductor layers. The thickness of each layer has a thickness of between about 3 Å to 40 Å. The density of the dislocations in the upper surface 42 of the second semiconductor layer 40 may be greater than that in the lower surface 41 thereof.

The second semiconductor layer 40 serves to reduce the density of the dislocations 21 and change the propagation direction to (0001) direction, thus enhancing the quality of layers grown on the second semiconductor layer 40 and making charges even.

The first conductivity type semiconductor layer 50 is formed on the second semiconductor layer 40, and has a higher level of electricity conductivity than that of the second semiconductor layer 30.

The first conductivity type semiconductor layer 50 may be formed of a semiconductor material having a composition formula represented by $In_xAl_yGa_{1-x-y}N$ ($0 \leq x \leq 1$, $0 \leq y \leq 1$, $0 \leq x+y \leq 1$) doped with first conductivity type impurities. The first conductivity type semiconductor layer 50 may be formed of at least one of GaN, InN, AlN, InGaN, AlGaN, InAlGaN, AlInN, AlGaAs, GaP, GaAs, GaAsP, and AlGaInP. The first conductivity type impurities may include n-type impurities such as Si, Ge, and Sn. For example, the first conductivity type semiconductor layer 50 may be formed as a GaN-based layer, and has a thickness ranging from about 1 μm to 5 μm. The dislocations 21 exist in the first conductivity type semiconductor layer 60.

The first nitride semiconductor layer 60 is formed on the first conductivity type semiconductor layer 50, and may be defined as a pit generation layer. The first nitride semiconductor layer 60 is formed as an indium-based semiconductor layer, and may be doped with first conductivity type impurities. The first nitride semiconductor layer 60 may have the first conductivity type impurities and be formed as a different semiconductor layer than the first conductivity type semiconductor layer 50.

For example, the first nitride semiconductor layer 60 may be formed of a material having a composition formula represented by $In_xGa_{1-x}N$ ($0.3 \leq x \leq 1$) doped with the first conductivity type impurities, and may be formed of InGaN or InN. The thickness of the first nitride semiconductor layer 60 may range from about 0.35 nm to 5 nm but is not limited thereto.

The first nitride semiconductor layer 60 includes a plurality of indium clusters, and the indium clusters have an indium composition greater than an indium composition of at least one of well layers of the active layer 70.

The dislocations 21 are present in the first nitride semiconductor layer 60 and are generated as pits by the clustered region. Pits are generated in the upper portion of the first nitride semiconductor layer 60 due to lattice mismatch between gallium (Ga) and indium (In). The pits generated from the first nitride semiconductor layer 60 may be made by the high In content such as In-rich or In-like, internal compressive stress, and indium clusters. The pits may be formed in a cavity or reversed horn shape.

The first nitride semiconductor layer 60 allows electrons input through the first conductivity type semiconductor layer 50 to easily propagate and move in the horizontal direction.

The pit generated from the first nitride semiconductor layer 60 extends into the active layer 70, and is provided in plurality. Accordingly, the active layer 70 has a plurality of pits 71 and dislocations 21. In the opened region 71A of each pit 71, a portion of a semiconductor layer, for example, at least one of the second nitride semiconductor layer 80, a well layer and a barrier layer may be disposed. At least one of the pits 71 may start from the lower part of the active layer 70 and/or the upper surface 61 of the first nitride semiconductor layer 70. The pit 71 may have the shape formed by at least two sidewalls from the end of the dislocation 21, for example, a V or reversed-horn shape, and may include an opened region 71A.

The pit 71 is formed by the lattice mismatch between the active layer 70 and the first nitride semiconductor layer 60. For example, the pit 71 may be formed by the indium clusters and compressive stress inside the first nitride semiconductor layer 60.

The active layer 70 is formed on the first nitride semiconductor layer 60. The active layer 70 may be formed into at least one of a single quantum well structure, a multi quantum well (MQW) structure, a quantum dot structure, and a quantum wire structure. The active layer 70 may be formed of a semiconductor material having a composition formula represented by $In_xAl_yGa_{1-x-y}N$ ($0 \leq y \leq 1$, $0 \leq x+y \leq 1$). When the active layer 70 has the multi quantum well structure, the active layer 70 may be formed by stacking a plurality of well layers and a plurality of barrier layers. The well layers may be formed as semiconductor layers having a composition formula represented by $In_xAl_yGa_{1-x-y}N$ ($0 \leq x \leq 1$, $0 \leq y \leq 1$, $0 \leq x+y \leq 1$), and the barrier layers may be formed as semiconductor layers having a composition formula represented by ($0 \leq x \leq 1$, $0 \leq y \leq 1$, $0 \leq x+y \leq 1$). The active layer 70 may be formed by repeatedly stacking InGaN well layer/GaN barrier layer, InGaN well layer/AlGaN barrier layer, or InGaN well layer/InGaN barrier layer.

When the active layer 70 is formed as a stacked structure of $In_xGa_{1-x}N$ well layer/$In_xGa_{1-x}N$ barrier layer, the barrier layer is formed as an InGaN barrier layer having a composition formula represented by $In_xGa_{1-x}N$ ($0 \leq x \leq 0.05$), and the barrier layer is formed as an InGaN well layer having a composition formula represented by $In_xGa_{1-x}N$ ($0.03 < x \leq 0.2$). The InGaN barrier and InGaN well layers may be repeatedly stacked. That is, the InGaN well layer has higher indium content than that of the InGaN barrier layer. The barrier layer may be formed of a material having a greater band gap than the well layer.

In another example, the indium composition of the InGaN-based well layer may range from about 3% to 20%, and the thickness thereof may range from about 2 nm to 3 nm. The indium composition of the barrier layer may range from about 0% to 5%, and the thickness thereof may range from about 3 nm to 15 nm, and in an embodiment, the barrier layer may have a thickness ranging from about 5 nm to 8 nm.

As another example, the active layer 70 may include a structure of lower and upper active layers. The lower active layer is formed by alternately disposing a first well layer and a first barrier layer, and the upper active layer is formed by alternately disposing a second well layer and a second barrier layer. Here, the first well layer may have an indium composition of 10% or less, which is lower than the indium composition of the second well layer, and the second well layer may have an indium composition of 10% or higher.

The active layer 70 may be formed of a selected material having band gap energy according to the wavelength of light being emitted, and may selectively include a material that emits light of a visible light band such as a blue wavelength, a red wavelength and a red wavelength. The active layer 70 may include a material emitting light of an ultraviolet band, and the material is not limited thereto.

A first conductivity type clad layer may be formed between the first nitride semiconductor layer 60 and the active layer 70, and the first conductivity type clad layer may be formed as an n-type semiconductor layer. The first conductivity type clad layer may be formed of a GaN-based semiconductor, has a band gap that is greater than the band gap of the barrier layer within the active layer 70, and serves to confine carriers. Pits may be formed in the first conductivity type clad layer, and the pits may extend from the first nitride semiconductor layer 60.

A second conductivity type clad layer may be formed between the active layer 70 and the second nitride semiconductor layer 80, and the second conductivity type clad layer may be formed of a GaN-based semiconductor, has a band gap that is greater than that of the barrier layer within the active layer 70, and serves to confine carriers. Pits may be formed in the second conductivity type clad layer, and the pits may extend from the active layer 70.

The second nitride semiconductor layer 80 is formed on the active layer 70. The second nitride semiconductor layer 80 may be doped with second conductivity type impurities. The second nitride semiconductor layer 80 may be formed of for example, a material having a composition formula represented by $In_xGa_{1-x}N$ ($0 < x \leq 1$) doped with the second conductivity type impurities, and may be formed of InGaN or InN. The second nitride semiconductor layer 80 may have a lower indium composition than that of the first nitride semiconductor layer 60.

The second conductivity type impurities may be p-type impurities such as Mg, Zn, Ca, Sr, Ba and the like. For example, the second nitride semiconductor layer 80 may be formed as an InGaN layer doped with Mg. The second nitride semiconductor layer 80 has second conductivity type impurities, and may be formed as a different semiconductor layer than the second conductivity type semiconductor layer 90.

In another example, the second nitride semiconductor layer 80 may be formed as an aluminum-based semiconductor layer, and may be formed of a semiconductor having a composition formula represented by $In_xAl_yGa_{1-x-y}N$ ($0 \leq x \leq 1$, $0 < y \leq 1$, $0 \leq x+y \leq 1$). The second nitride semiconductor layer 80 may be formed of a material having small particles to thus block the pits propagating to the second conductivity type semiconductor layer 90.

The second nitride semiconductor layer 80 may be defined as a pit blocking layer, and serves to suppress the propagation of the pits 71 existing in the active layer 70. The second nitride semiconductor layer 80 may have a thickness ranging from about 5 nm to 15 nm, and may be thicker than the first nitride semiconductor layer 60.

The first nitride semiconductor layer 60 induces the dislocations 21 and the pits 71 to the active layer 70, and the second nitride semiconductor layer 80 serves to prevent the dislocations 21 and the pits 71 from propagating to the second conductivity type semiconductor layer 90.

The first nitride semiconductor layer 60 causes the dislocations 21, discontinued at the boundary between the first conductivity type semiconductor layer 50 and the active layer 70, to extend to the active layer 70, and further increases defects while forming a plurality of indium clusters. The indium clusters may be formed as indium is partially clustered. The first nitride semiconductor layer 60 includes the pits, and the pits generated by the first nitride semiconductor layer 60 extend to the pits 71 of the active layer 70. The pit 71 is connected to the end of at least one of the dislocations 21 and provided in plurality within the active layer 70. The pits 71 may have different sizes. The sidewall of each pit 71 may be inclined at angle θ1 ranging from about 58° to 63° with respect to the lower surface of the active layer 70. Furthermore, the maximum diameter D1 of the pit 71 may be (T×2)/tan(θ1), where T denotes the thickness of the active layer 70, which ranges from about 100 Å to 500 Å.

The sidewall of the pit 71 is inclined with respect to the lower surface of the active layer 70, and the opened region 71A of the pit 71 is widened toward the second conductivity type semiconductor layer 90.

The lower end of the pit 71 is located at the upper surface 61 of the first nitride semiconductor layer 60, at a lower level than the upper surface 61 of the first nitride semiconductor layer 60, or within the active layer 70. The first nitride semiconductor layer 60 may be formed as a layer having a greater indium composition than that of the well layer of the active layer 70. The density of the pits 71 may be 1 to $5 \times 10^8/cm^2$ in the active layer 70.

The pits 71 started at the first nitride semiconductor layer 60 and the propagated dislocations 21 are expressed as the pits 71 in the active layer 70. Each pit 71 is a V-shaped defect and may be called V-pit. A portion of the well layer/barrier layer may be formed in the pit 71, and the pit 71 increases the luminous intensity of light emitted from the active layer 70 and improves ESD characteristics.

The second nitride semiconductor layer 80 prevents the dislocations and the pits 71 from propagating above the active layer 70. The second nitride semiconductor layer 80 may have a thickness ranging from about 5 nm to 15 nm, which is thick enough to prevent the pits 71 from extending to the upper surface of the second nitride semiconductor layer 80. The upper surface of the second nitride semiconductor layer 80 may be flatter than the lower surface 81 thereof.

The second nitride semiconductor layer 80 is disposed between the active layer 70 and the second conductivity type semiconductor layer 90, and prevents pits from being generated in the second conductivity type semiconductor layer 90 by the pits 71 of the active layer 70. Accordingly, the second nitride semiconductor layer 80 can prevent leakage current and increase luminous intensity.

A portion of the second nitride semiconductor layer 80 may be formed in the opened region 71A of at least one pit 71. Here, the second nitride semiconductor layer 80 may be formed of AlGaN or InAlGaN, and in this case, aluminum particles are combined in the pit 71 and fill the opened region 71A of the pit 71, thus preventing the pit 71 from propagating to the second conductivity type semiconductor layer 90. Accordingly, the pits 71 and the dislocations 21 may be removed at the second nitride semiconductor layer 80 without extending to the second conductivity type semiconductor layer 90. The lower surface 81 of the second nitride semiconductor layer 80 may be roughly formed due to the opened regions 71A of the pits 71. The lower surface 81 of the second nitride semiconductor layer 80 may come into contact with any one of the plurality of pits 71.

The pit 71 is spaced apart from at least one of the lower surface of the second nitride semiconductor layer 80 and the upper surface of the first nitride semiconductor layer 60. Furthermore, the pit 71 may be spaced apart from the upper surface of the second nitride semiconductor layer 80 and the upper surface 61 of the first nitride semiconductor layer 60.

The second conductivity type semiconductor layer 90 may be formed of a semiconductor material having a composition formula represented by $In_xAl_yGa_{1-x-y}N$ ($0 \leq x \leq 1$, $0 \leq y \leq 1$, $0 \leq x+y \leq 1$) doped with second conductivity type impurities. The second conductivity type semiconductor layer 90 may be formed of, for example, at least one of GaN, InN, AlN, InGaN, AlGaN, InAlGaN, AlInN, AlGaAs, GaP, GaAs, GaAsP, and AlGaInP. At least one of the second nitride semiconductor layer 80 and the second conductivity type semiconductor layer 90 may have a superlattice structure, and the superlattice structure includes first and second layers that are different from each other, and pairs of first and second layers are alternately disposed.

A first conductivity type semiconductor layer may be further formed on the second conductivity type semiconductor layer 90, and the first conductivity type semiconductor layer has the opposite polarity to that of the second conductivity type, and may be formed of at least one of compound semiconductor such as GaN, InN, AlN, InGaN, AlGaN, InAlGaN, AlInN, and the like. The first conductivity type semiconductor layer 50 and the first conductivity type semiconductor layer may be formed as, for example, n-type semiconductor layers.

A light emitting structure 55 may include the first conductivity type semiconductor layer 50, the first nitride semiconductor layer 60, the active layer 70, the second nitride semiconductor layer 80, and the second conductivity type semiconductor layer 90. The first conductivity type semiconductor layer may be formed on the second conductivity type semiconductor layer 90. Also, the first conductivity type may be a p-type semiconductor, and the second conductivity type may be an n-type semiconductor. The light emitting structure 55 may be implemented in any one structure of an N—P junction structure, a P—N junction structure, an N—P—N junction structure, and a P—N—P junction structure. In the following description, a structure in which the uppermost layer of the light emitting structure 55 is disposed will be described.

FIGS. 2 to 7 are views illustrating the process of fabricating the light emitting device depicted in FIG. 1.

Figure 2:
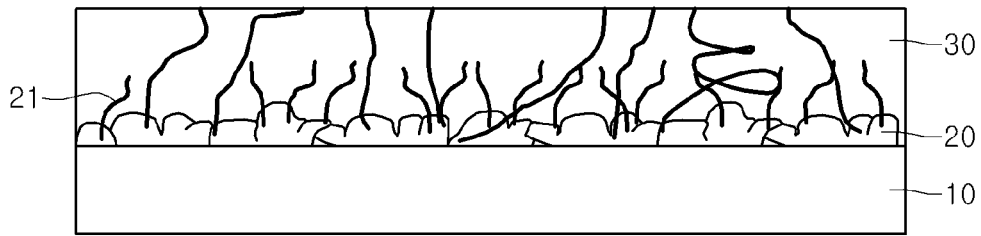
FIGS. 2 to 7 are views illustrating the process of fabricating the light emitting device, depicted in FIG. 1, according to an embodiment.

Referring to FIG. 2, the substrate 10 is loaded in growth equipment, and a plurality of semiconductor layers are grown on the substrate 10. The substrate 10 is a growth substrate, and may selectively utilize an insulating, transparent, or conductive substrate. The substrate 10 may utilize at least one of sapphire ($Al_2O_3$), SiC, Si, GaAs, GaN, ZnO, GaP, InP, and Ge. A light extraction structure such as an uneven pattern may be formed on and/or under the substrate 10, and the shape of the uneven pattern may be one of a stripe shape, a lens shape, a column shape and a horn shape.

A semiconductor layer is grown on the substrate 10, and the growth equipment may be formed by an electron beam evaporator, physical vapor deposition (PVD), chemical vapor deposition (CVD), plasma laser deposition (PLD), a dual-type thermal evaporator, sputtering, metal organic chemical vapor deposition (MOCVD), and the like, but it is not limited to the description. The semiconductor layer is formed of a compound semiconductor having a composition formula represented by $InAl_yGa_{1-x-y}N$ ($0 \leq x \leq 1$, $0 \leq y \leq 1$, $0 \leq x+y \leq 1$).

The buffer layer 20 is formed on the substrate 10. The buffer layer 20 may reduce lattice mismatch between a nitride material and a substrate material, and may be formed of at least one of GaN, InN, AlN, InGaN, AlGaN, InAlGaN, and AlInN. The buffer layer 20 may be formed of AlN and is grown at a temperature ranging from about 900° C. to 1050° C. to have a thickness of between about 10 Å and 200 Å.

Figure 3:
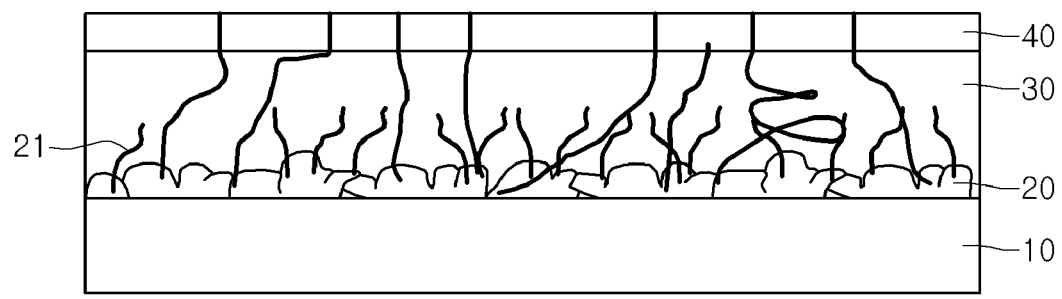

Referring to FIG. 3, the first semiconductor layer 30 is formed on the buffer layer 20, the second semiconductor layer 40 is formed on the first semiconductor layer 30, and the first conductivity type semiconductor layer 50 is formed on the second semiconductor layer 40.

The first semiconductor layer 30 may be a GaN-based semiconductor layer, and may be formed as an undoped GaN layer, for example. The first semiconductor layer 30 is grown at a temperature of between about 900° C. and 1050° C. to have a thickness ranging from about 0.5 μm to 2 μm. The first semiconductor layer 30, although not subjected to intentional doping, has the characteristics of first conductivity type.

The second semiconductor layer 40 may be formed as, for example, a GaN-based layer. The second semiconductor layer 40 is grown at a low temperature of between about 700° C. and 800° C. to have a thickness ranging from about 500 Å to 3000 Å. The second semiconductor layer 40 may be grown at a lower temperature than the growth temperature of the first conductivity type semiconductor layer 50. Since the second semiconductor layer 40 is grown at a low temperature, it can suppress the upward propagation of the dislocations 21.

Figure 4:
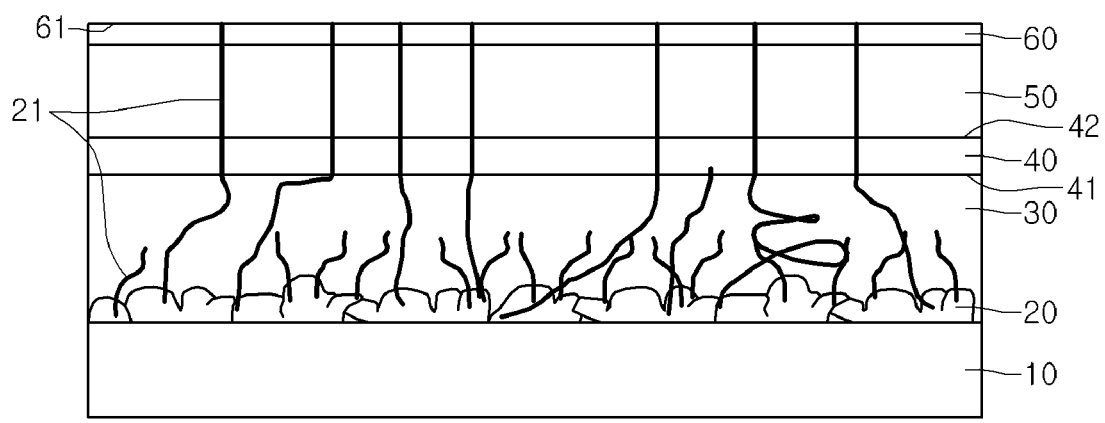

Referring to FIG. 4, the first conductivity type semiconductor layer 50 is formed on the second semiconductor layer 40. The first conductivity type semiconductor layer 50 may be formed of a semiconductor material having a composition formula represented by $In_xAl_yGa_{1-x-y}N$ ($0 \leq x \leq 1$, $0 \leq y \leq 1$, $0 \leq x+y \leq 1$) doped with first conductivity type impurities, and the first conductivity type impurities may be n-type impurities such as Si, Ge, Sn or the like. For example, the first conductivity type semiconductor layer 50 may be a Si-doped GaN layer. The first conductivity type semiconductor layer 50 is grown at a temperature of between about 900° C. and 1050° C. to have a thickness ranging about 1 μm to 5 μm.

The first nitride semiconductor layer is formed on the first conductivity type semiconductor layer 50. The first nitride semiconductor layer 60 is formed as an indium-based semiconductor layer, and may be doped with first conductivity type impurities.

The first nitride semiconductor layer 60 may be formed of, for example, a material having a composition formula represented by $In_xGa_{1-x}N$ ($0.3 \leq x \leq 1$) doped with first conductivity type impurities, and may be formed of InGaN or InN. The first nitride semiconductor layer 60 may be formed to have a thickness ranging from about 0.35 nm to 5 nm, but is not limited thereto. Here, the indium composition of the first nitride semiconductor layer 60 may be higher than that of the well layer of the active layer. Here, the indium composition of the first nitride semiconductor layer 60 may be varied according to a growth temperature, and may be 5% or higher (i.e., x=0.05).

Figure 5:
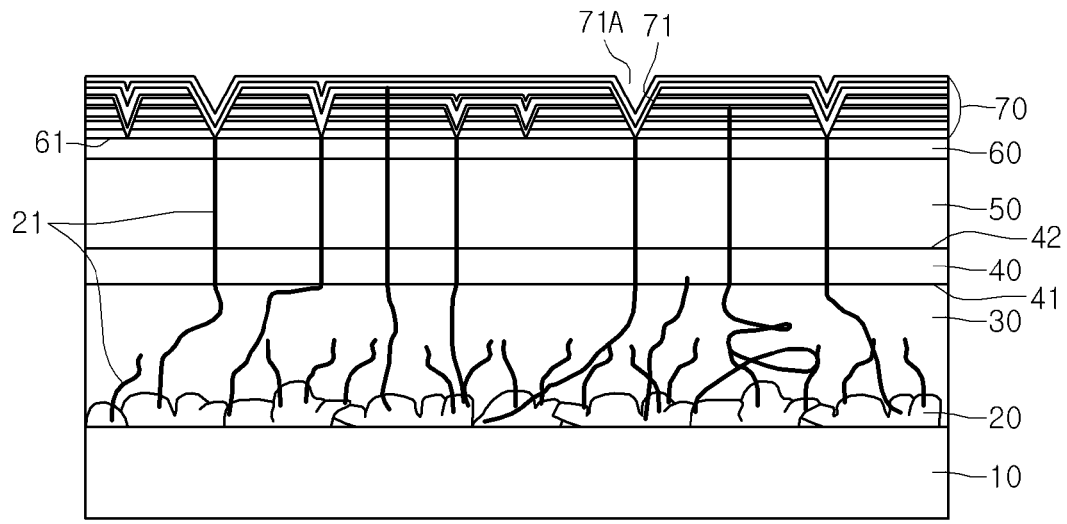

Referring to FIG. 5, the active layer 70 is formed on the first nitride semiconductor layer 60. The active layer 70 may have at least one structure of a single quantum well structure, a multi quantum well (MQW) structure, a quantum dot structure, and a quantum wire structure, but it is not limited thereto. The active layer 70 may be formed of a semiconductor material having a composition formula represented by $In_xAl_yGa_{1-x-y}N$ ($0 \leq x \leq 1$, $0 \leq y \leq 1$, $0 \leq x+y \leq 1$). In a case where the active layer 70 has the multi quantum well structure, the active layer 70 may be formed by stacking a plurality of well layers and a plurality of barrier layers. The well layers may each be formed as a semiconductor layer having a composition formula represented by $In_xAl_yGa_{1-x-y}N$ ($0 \leq x \leq 1$, $0 \leq y \leq 1$, $0 \leq x+y \leq 1$), and the barrier layers may each be formed as a semiconductor layer having a composition formula represented by $In_xAl_yGa_{1-x-y}N$ ($0 \leq x \leq 1$, $0 \leq y \leq 1$, $0 \leq x+y \leq 1$). The active layer 70 may be formed by repeatedly stacking InGaN well layer/GaN barrier layer or InGaN well layer/InGaN barrier layer, for example.

In a case where the active layer 70 has the stacked structure of $In_xGa_{1-x}N$ well layer/$In_xGa_{1-x}N$ barrier layer, the barrier layer is formed as an InGaN barrier layer having a composition formula represented by $In_xGa_{1-x}N$ ($0 \leq x \leq 0.05$), the well layer is formed as an InGaN well layer having a composition formula represented by $In_xGa_{1-x}N$ ($0.03 < x \leq 0.2$), and the indium composition of the well layer is higher than that of the barrier layer. The InGaN barrier and InGaN well layers may be repeatedly stacked.

The InGaN-based well layer has an indium composition of between about 3% and 20%, and a thickness of between about 2 nm and 3 nm. The barrier layer has an indium composition of between about 0% and 5%, and a thickness of between about 3 nm and 15 nm. In an embodiment, the barrier layer may have a thickness of between 5 nm and 8 nm.

The active layer 70 has the structure of lower and upper active layers, and the lower active layer is formed by alternately disposing first well layer/first barrier layer, and the upper active layer is formed by alternately disposing second well layer/second barrier layer. Here, the first well layer may have an indium composition of 10% or less, which is lower than the indium composition of the second well layer, and the second well layer may have an indium composition of 10% or higher.

Figure 6:
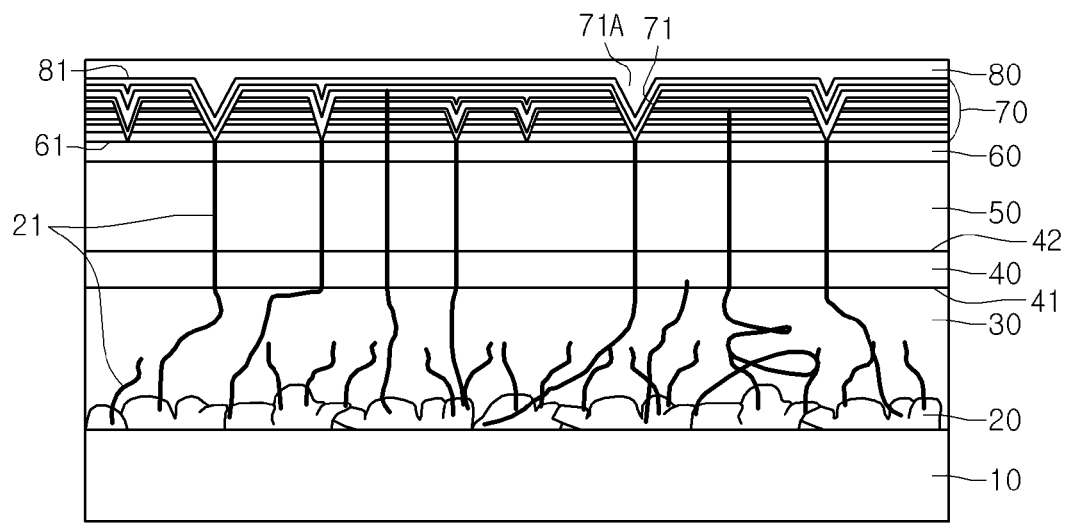

Referring to FIG. 6, the second nitride semiconductor layer 80 is formed on the active layer 70. The second nitride semiconductor layer 80 may be doped with second conductivity type impurities. The second nitride semiconductor layer 80 may be formed of for example, a material having a composition formula represented by $In_xGa_{1-x}N$ ($0 < x \leq 1$) doped with the second conductivity type impurities, and may be formed of InGaN or InN. The second nitride semiconductor layer 80 may have a lower indium composition than the first nitride semiconductor layer 60.

The second conductivity type impurities may be p-type impurities such as Mg, Zn, Ca, Sr, Ba or the like. For example, the second nitride semiconductor layer 80 may be formed as an InGaN layer doped with Mg.

In another example, the second nitride semiconductor layer 80 may be an Al-based semiconductor layer, and may be formed as a semiconductor layer having a composition formula represented by $In_xAl_yGa_{1-x-y}N$ ($0 \leq x \leq 1$, $0 < y \leq 1$, $0 \leq x+y \leq 1$). The second nitride semiconductor layer 80 is formed of a material with small particles to thus block a defect propagating to the second conductivity type semiconductor layer 90. The thickness of the second nitride semiconductor layer 80 may range from about 5 nm to 15 nm.

Figure 7:
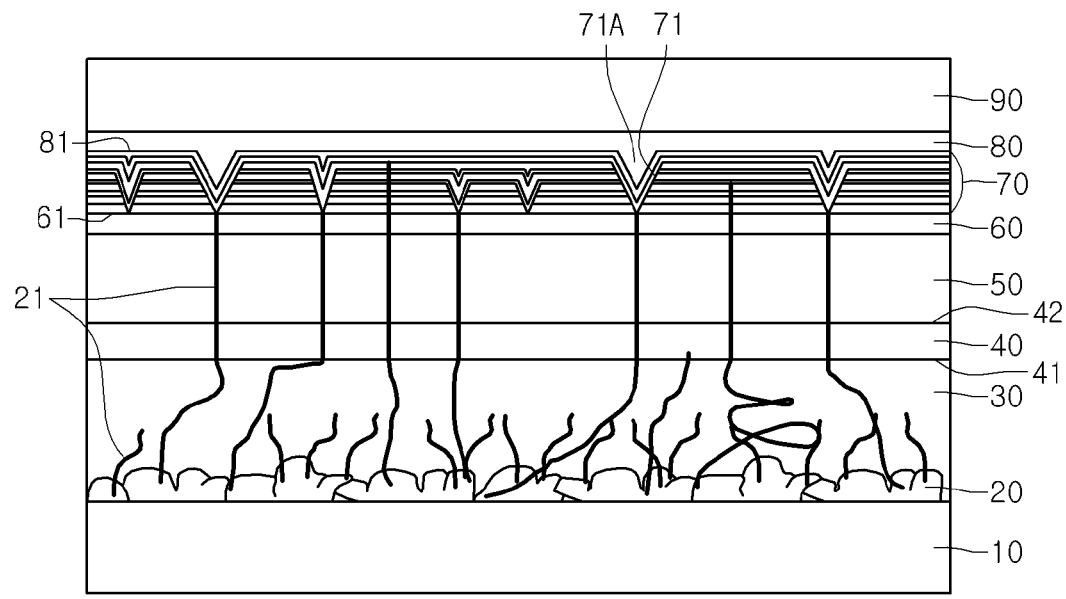

Referring to FIG. 7, the second conductivity type semiconductor layer 90 is formed on the second nitride semiconductor layer 80. The second conductivity type semiconductor layer 90 may be formed of, for example, a material having a composition formula represented by $In_xAl_yGa_{1-x-y}N$ ($0 \leq x \leq 1$, $0 \leq y \leq 1$, $0 \leq x+y \leq 1$) doped with second conductivity type impurities.

A structure from the first semiconductor layer 50 to the second conductivity type semiconductor layer 90 may be defined as the light emitting structure 55, and the light emitting structure 55 includes a nitride semiconductor layer and may selectively emit light from an ultraviolet band to a visible band.

The first nitride semiconductor layer 60 may come into contact with the upper surface of the first conductivity type semiconductor layer 50, the active layer 70 may come into contact with the upper surface of the first nitride semiconductor layer 60, and the second nitride semiconductor layer 80 may come into contact with the upper surface of the active layer 70.

Meanwhile, when the buffer layer 20 is formed on the substrate 10, and the first semiconductor layer 30 is formed on the buffer layer 20, dislocations 21 are generated by the difference in lattice constant. The dislocation 21 propagates in the direction of the active layer 70 as the second semiconductor layer 40 and the first conductivity type semiconductor layer 50 are grown. Pits 71 are generated in the active layer 70.

Due to the low-temperature growth, the second semiconductor layer 4 can alleviate the dislocations 21. The density of the dislocations 21 in the second semiconductor layer 40 may be lower in the upper surface 42 thereof than in the lower surface 41.

In an embodiment, the second semiconductor layer 40 and the first nitride semiconductor layer 60 induce the dislocations 21 and the pits 71 to the active layer 70, and the second nitride semiconductor layer 80 prevents the dislocations 21 and the pits 71 from propagating above the active layer 70.

The second semiconductor layer 40 reduces the density of the dislocations 21 and changes the propagation direction thereof to (0001) direction, thus enhancing the quality of layers grown on the second semiconductor layer 40 and making charges even.

The first nitride semiconductor layer 60 allows the dislocations 21, discontinued at the boundary between the first conductivity type semiconductor layer 50 and the active layer 70, to extend to the active layer 70, and further increases a defect by forming a plurality of indium clusters. The indium clusters may be formed as the indium is partially clustered. Pits are included in the first nitride semiconductor layer 60, and the pits starting from the first nitride semiconductor layer 60 cause the formation of pits 71 of the active layer 70. The first nitride semiconductor layer 60 allows electrons to easily propagate and move in a horizontal direction in the first conductivity type semiconductor layer 50.

The pits 71 are formed due to lattice mismatch between the active layer 70 and the first nitride semiconductor layer 60. For example, indium clusters are generated by compressive stress within the first nitride semiconductor layer 60, and the pits 71 may be formed by the indium clusters. There are a plurality of pits 71, and each pit 71 may have a different size. The sidewall of each pit 71 may be inclined at an angle of between about 58° and 63° with respect to the bottom surface of the active layer 70. The sidewalls of the plurality of pits 71 may be inclined at the same angle. Furthermore, the maximum diameter of the pits 71 may be $(T \times 2)/\tan(\theta 1)$ where T denotes the thickness of the active layer 70.

The sidewall of the pit 71 is inclined with respect to the lower surface of the active layer 70, and the opened region 71A of the pit 71 is widened toward the second conductivity type semiconductor layer 90.

The lower end of the pit 71 is formed at the upper surface of the first nitride semiconductor layer 60, at a lower level than the upper surface of the first nitride semiconductor layer 60, or within the active layer 70. The first nitride semiconductor layer 60 may have a higher indium composition than that of the well layer of the active layer 70. The density of the pits 71 may be 1 to $5 \times 10^8/cm^2$ in the active layer 70.

The pits starting from the first nitride semiconductor layer 60 and the propagated dislocations 21 are expressed as the pits 71 in the active layer 70. Each pit 71 is a V-shaped defect and may be called V-pit. A portion of the well layer/barrier layer may be formed in the pit 71, and the pit 71 increases the luminous intensity of light emitted from the active layer 70 and improves ESD characteristics.

The second nitride semiconductor layer 80 prevents the dislocations and the pits 71 from propagating above the active layer 70. The second nitride semiconductor layer 80 may have a thickness ranging from about 5 nm to 15 nm, which is thick enough to avoid roughness, caused by the pits 71, in the upper surface of the second nitride semiconductor layer 80. That is, the upper surface of the second nitride semiconductor layer 80 may be flatter than the lower surface 81 thereof. At least one of the plurality of pits 71 may be disposed between the upper surface 61 of the first nitride semiconductor layer 60 and the upper surface of the second nitride semiconductor layer 80 or disposed within the active layer 70.

The second nitride semiconductor layer 80 is disposed between the active layer 70 and the second conductivity type semiconductor layer, and prevents pits from being generated in the second conductivity type semiconductor layer 90 by the pits 71 of the active layer 70. Accordingly, the second nitride semiconductor layer 80 can prevent leakage current and increase luminous intensity.

The lower portion of the second nitride semiconductor layer 80 may be formed in the opened region 71A of at least one pit 71. Here, the second nitride semiconductor layer 80 may be formed of AlGaN or InAlGaN, and in this case, aluminum particles are combined in the pit 71 and fill the opened region 71A of the pit 71, thus preventing the pit 71 from propagating to the second conductivity type semiconductor layer 90. Accordingly, the pits 71 may be removed without extending to the upper surface of the second conductivity type semiconductor layer 90. The lower surface 81 of the second nitride semiconductor layer 80 may be roughly formed due to the pits 71.

Figure 8:
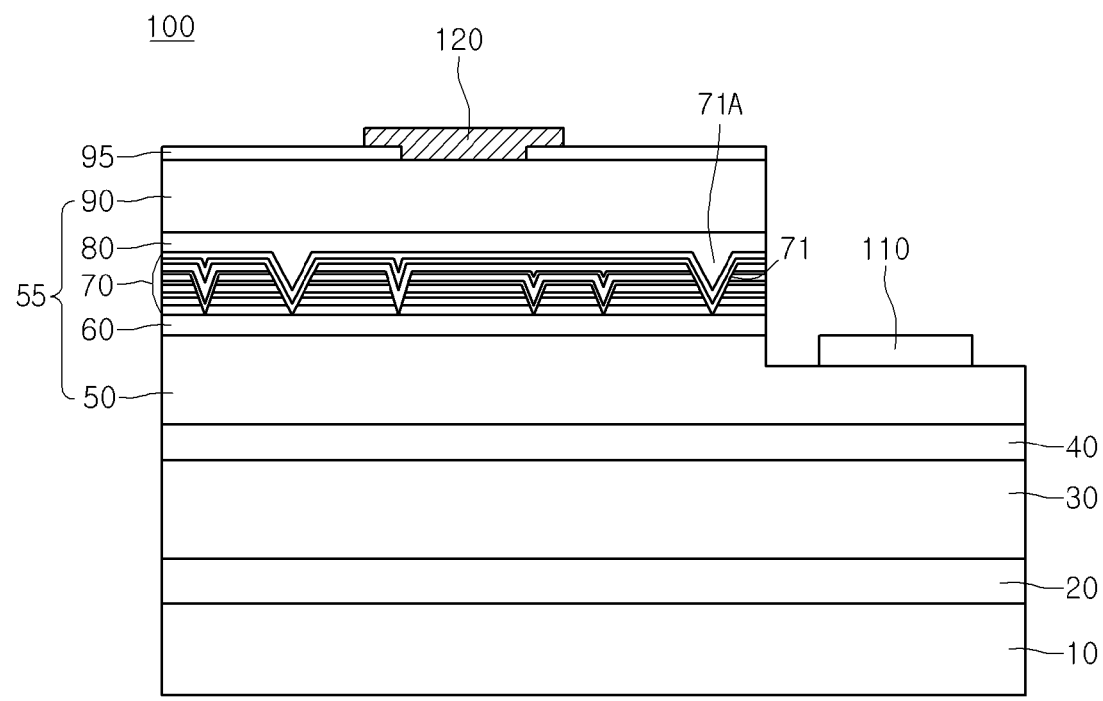
FIG. 8 illustrates an example of forming a horizontal electrode in the light emitting device depicted in FIG. 1.

FIG. 8 is a view illustrating a horizontal light emitting device including the light emitting device depicted in FIG. 1. Referring to FIG. 8, mesa-etching is performed so as to partially expose the first conductivity type semiconductor layer 50. A first electrode 110 is formed on the first conductivity type semiconductor layer 50, a current diffusion layer 95 is formed on the second conductivity type semiconductor layer 95, and a second electrode 120 is formed on the current diffusion layer 95.

The current diffusion layer 95 may be a transparent layer or a reflective layer. The transparent layer may include, for example, at least one of indium tin oxide (ITO), indium zinc oxide (IZO), indium zinc tin oxide (IZTO), indium aluminum zinc oxide (IAZO), IZON, ATON indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO. The reflective layer may include at least one of Ag, Ag-alloy, Al, Al-alloy, Ni, Pt, and Pd.

At least one of the first electrode 110 and the second electrode 120, although not limited thereto, may be formed as at least one layer of Ag, Ag alloy, Ni, Al, Al alloy, Rh, Pd, Ir, Ru, Mg, Zn, Pt, Au, Hf, and an allow thereof.

Figure 9:
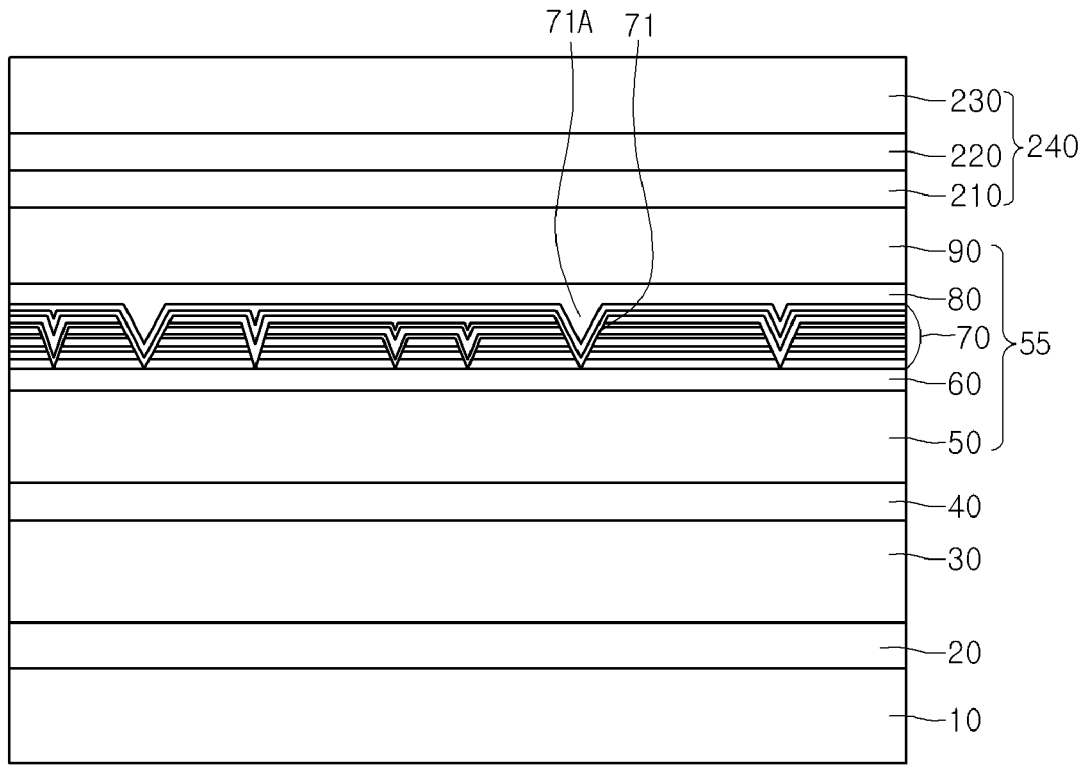
FIGS. 9 to 11 are views illustrating the process of forming a vertical electrode in the light emitting device depicted in FIG. 1.
Figure 10:
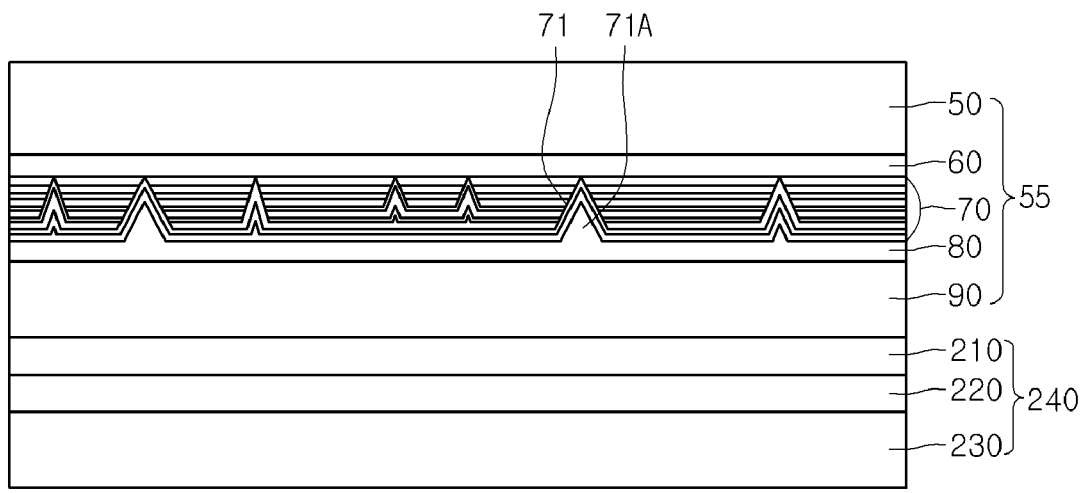
Figure 11:
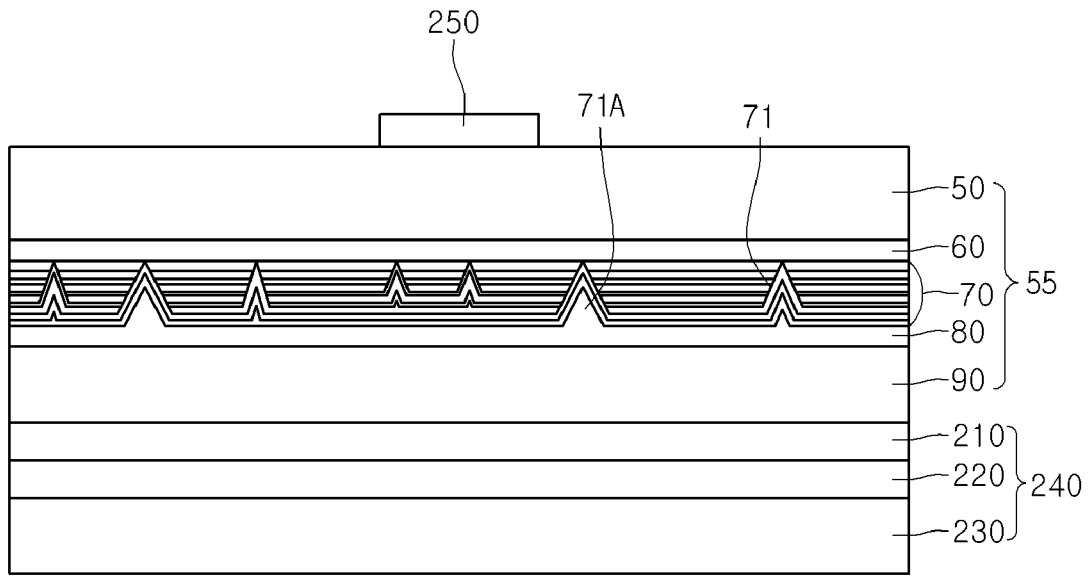

FIGS. 9 to 11 are views illustrating a light emitting device having a vertical electrode structure using the light emitting device depicted in FIG. 1, and a process of fabricating the same.

Referring to FIG. 9, a support substrate including an ohmic contact layer 210, a reflective layer 220 and a support member 230 is formed on the second conductivity type semiconductor layer 90.

The ohmic contact layer 210 is formed of a material coming into ohmic contact with the second conductivity type semiconductor layer 90, and may selectively utilize, for example, indium tin oxide (ITO), indium zinc oxide (IZO), indium zinc tin oxide (IZTO), indium aluminum zinc oxide (IAZO), IZON, ATON indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au, and Ni/$IrO_x$/Au/ITO.

The reflective layer 220 is formed of a material with a high level of reflectivity, and may be selectively formed of, for example, Ag, Ni, Al, Rh, Pd, Ir, Ru, Mg, Zn, Pt, Au, Hf, and an alloy thereof.

A support member 230 is formed on the reflective layer 220, and the support member 230 may be a conductive layer. The support member 230 may include at least one of titanium (Ti), chrome (Cr), nickel (Ni), aluminum (Al), platinum (Pt), gold (Au), tungsten (W), copper (Cu), molybdenum (Mo), and a carrier wafer (e.g., Si, Ge, GaAs, ZnO, SiC, SiGe, GaN, and the like). The ohmic contact layer 210 and/or the reflective layer 220 are not essential elements, and may be selectively formed.

Furthermore, the support member 230 may be formed by a plating method or a bonding method, and may have a mono-layered structure of a single material, or a multi-layered structure of a plurality of materials.

A bonding layer 170 may be disposed between the support member 230 and the reflective layer 220, and the bonding layer 170 may be formed of at least one of, for example, Ti, Au, Sn, Ni, Cr, Ga, In, Bi, Cu, Ag, Ta, and an alloy thereof.

Referring to FIGS. 9 and 10, in the structure depicted in FIG. 9, the substrate 10, the buffer layer 20, the first semiconductor layer 30, and the second semiconductor layer 40 are removed. In FIG. 10, the structure depicted in FIG. 9 is turned over and illustrated. A method for removing the substrate 10 may be a physical and/or chemical method. In the physical method, a substrate material allowing laser lift-off may be used, and in the chemical method, the substrate 10 may be separated by etching a region between the substrate 10 and the buffer layer or the first semiconductor layer 30. The buffer layer 20, the first semiconductor layer 30, and the second semiconductor layer 40 may be removed by wet etching and/or dry etching, or a polishing.

Referring to FIG. 11, a first electrode 250 is formed on the first conductivity type semiconductor layer 50. Thus, a vertical electrode structure in which the first electrode 250 is disposed on the light emitting structure and the support substrate 240 is disposed at a lower portion is provided.

Figure 12:
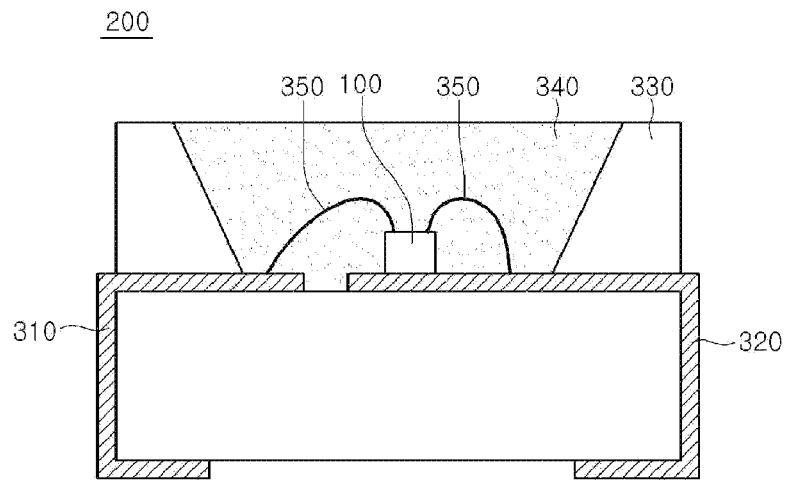
FIG. 12 is a cross-sectional view of a light emitting device package including the light emitting device depicted in FIG. 1.

FIG. 12 is a cross-sectional view of a light emitting device package including the light emitting device, depicted in FIG. 8, according to embodiments.

Referring to FIG. 12, a light emitting device package 200 includes a body 330, a first conductive layer 310 and a second conductive layer installed on the body, the light emitting device 100 of FIG. 8 installed in the body 330 and receiving power from the first conductive layer 310 and the second conductive layer, and a molding member 340 surrounding the light emitting device 100.

The body 330 may be formed of a silicon material, a synthetic resin material or a metallic material, and may have a cavity having a sidewall around the light emitting device 100.

The first conductive layer 310 and the second conductive layer 320 are electrically isolated from each other, and provide power to the light emitting device 100.

Furthermore, the first and second conductive layers 310 and 320 may reflect light generated from the light emitting device 100 to thus increase light efficiency, and may serve to dissipate heat, generated from the light emitting device 100, to the outside. the first and second conductive layers 310 and 320 is formed in a metal layer such as a lead frame.

The light emitting device 100 may be installed on at least one of the first conductive layer 310, the second conductive layer 320 and the body 330, and may be electrically connected to the first and second conductive layers 310 and 320 by a wire method, a die bonding method or the like, but the method is not limited thereto.

In an embodiment, the light emitting device 100 depicted in FIG. 8 is described by way of example, and a light emitting device depicted in FIG. 11 may be mounted. The light emitting device being mounted is not limited to the description.

The molding member 340 may protect the light emitting device 100 by surrounding the light emitting device 100. Also, the molding member 340 may include phosphors to change the wavelength of light emitted from the light emitting device 100.

Also, the light emitting device package 200 may be a chip on board (COB) type, the upper surface of the body 330 is flat, and a plurality of light emitting devices 100 may be installed on the body 330.

A plurality of light emitting device packages 200 according to an embodiment are arrayed on a substrate, and optical members such as a light guide, a prism sheet, a diffusion sheet, a phosphorus sheet and the like may be disposed on the path of light emitted from the light emitting device package 200. Such a light emitting device package 200, the substrate and the optical members may serve as a backlight unit. According to another embodiment, a lighting unit including the light emitting device 100 or the light emitting device package 200, disclosed in the above embodiments, may be implemented. For example, examples of the lighting unit may include a display device, an indication device, a lamp, and a streetlamp.

<Lighting System>

The light emitting devices and the light emitting device packages according to the embodiments may be applied to a light unit. The light unit may have an array structure including a plurality of light emitting devices or a plurality of light emitting device packages. The lighting system may include a display apparatus shown in FIGS. 13 and 14, a light unit shown in FIG. 15, in addition to a lighting lamp, a signal light, a vehicle headlight, an electronic display, etc.

Figure 13:
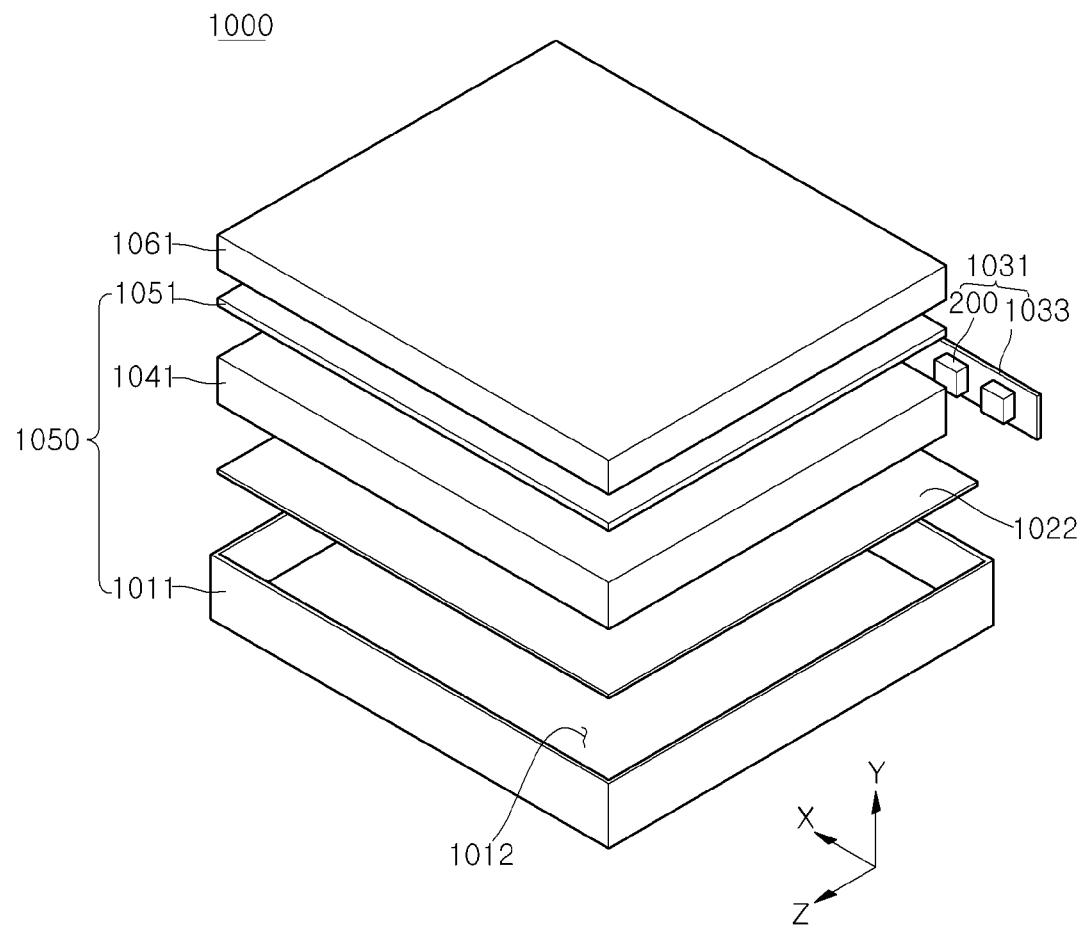
FIG. 13 is a disassembled perspective view of a display apparatus provided with the light emitting device or the light emitting device package.

FIG. 13 is a disassembled perspective view of a display apparatus according to an embodiment.

Referring to FIG. 13, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 200 according to embodiments disclosed above, and the light emitting device packages 200 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 200 is mounted on a side surface or a heat releasing plate, the board 1033 may be removed. Herein, some of the heat releasing plate may contact an upper surface of the bottom cover 1011.

The plurality of light emitting device packages 200 may be mounted on the board 1033 such that light emitting surfaces of the plurality of light emitting device packages 200 are spaced apart by a predetermined distance from the light guide panel 1041, but the present disclosure is not limited thereto. The light emitting device package 200 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

Figure 14:
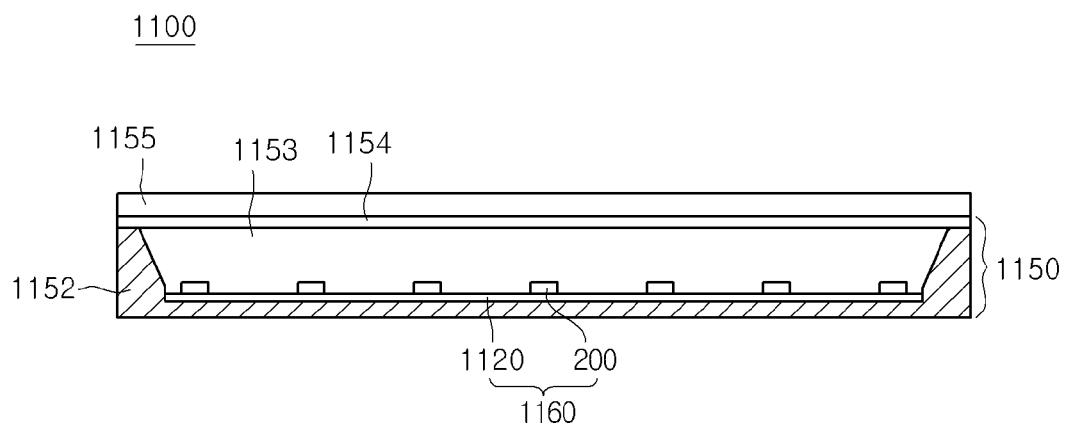
FIG. 14 is a schematic sectional view illustrating another example of a display apparatus provided with the light emitting device or the light emitting device package.

FIG. 14 is a cross-sectional view of a display apparatus according to an embodiment.

Referring to FIG. 14, the display apparatus 1100 includes a bottom cover 1152, a board 1120 on which the light emitting device packages 200 disclosed above are arrayed, an optical member 1154, and a display panel 1155.

The board 1120 and the light emitting device package 200 may be denied as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

Figure 15:
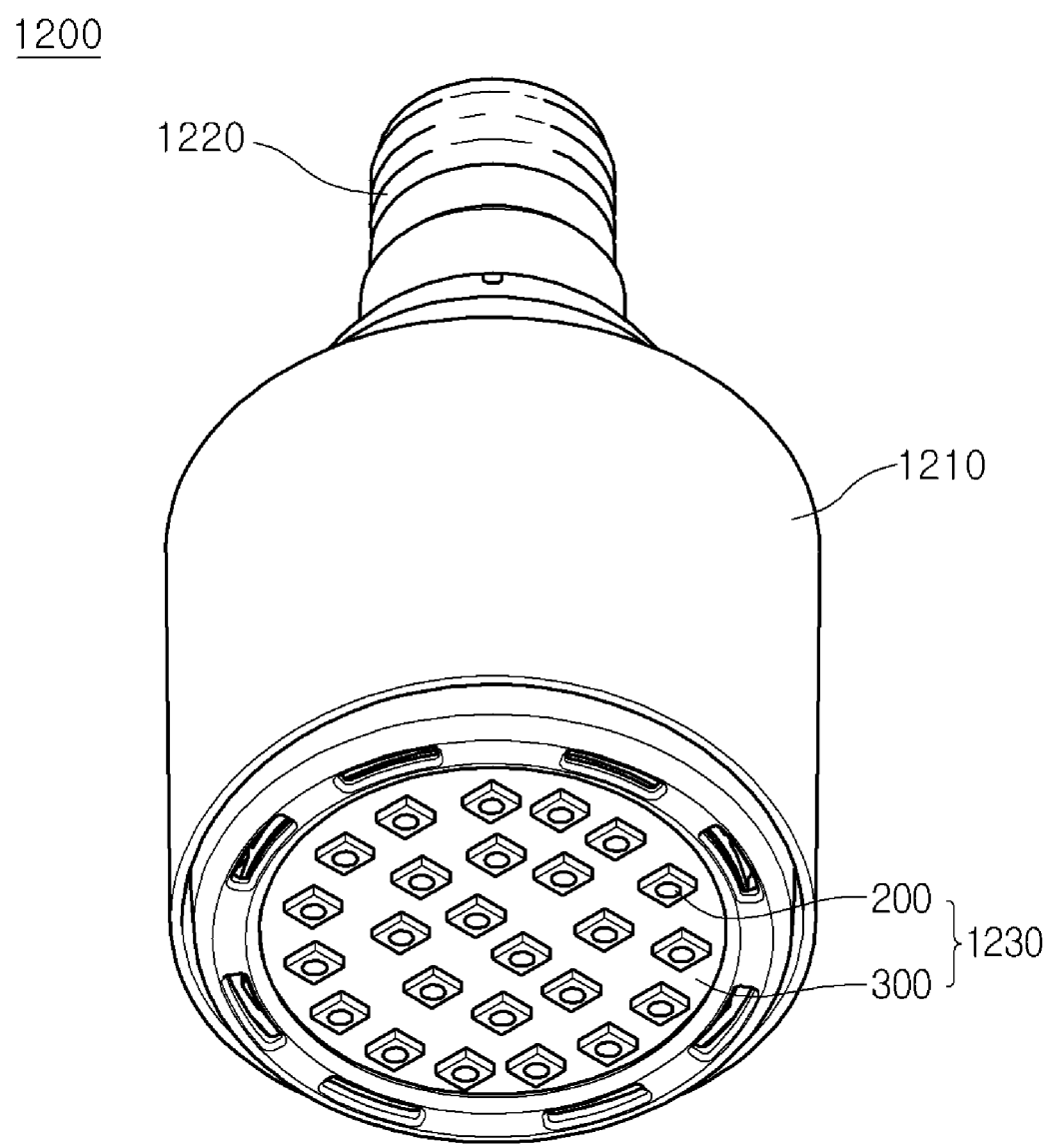
FIG. 15 is a perspective view of a lighting apparatus provided with the light emitting device or the light emitting device package.

FIG. 15 is a perspective view of a lighting unit according to an embodiment.

Referring to FIG. 15, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

Embodiments may provide a light emitting device having a noble structure, a method for fabricating the light emitting device, a light emitting device package, and a lighting system. Embodiments may also provide a light emitting device achieving a reduction in leakage current, a method for fabricating the light emitting device, a light emitting device package, and a lighting system. Embodiment may also provide a light emitting device with improved light emission efficiency, a method for fabricating the light emitting device, a light emitting device package, and a lighting system.

The features, structures, effects, etc., described in the above embodiments are included in at least one embodiment and are not necessarily limited to only one embodiment. Furthermore, the features, structures, effects, etc., exemplified in each embodiment may be combined and modified to be embodied together with other embodiments by those skilled in the art. Accordingly, the contents associated with such combinations and modifications would be construed as falling within the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a first conductivity type semiconductor layer;
   a second conductivity type semiconductor layer;
   an active layer disposed between the first conductivity type semiconductor layer and the second conductivity type semiconductor layer and comprising a plurality of well layers and a plurality of barrier layers;
   a first nitride semiconductor layer disposed between the first conductivity type semiconductor layer and the active layer; and
   a second nitride semiconductor layer disposed between the active layer and the second conductivity type semiconductor layer,
   wherein the first nitride semiconductor layer has a higher indium composition than that of at least one of the plurality of well layers.

2. The light emitting device according to claim 1, wherein the first nitride semiconductor layer has a composition formula represented by $In_xGa_{1-x}N$ ($0.3 \leq x \leq 1$).

3. The light emitting device according to claim 1, wherein the first nitride semiconductor layer comprises a plurality of dislocations and indium clusters.

4. The light emitting device according to claim 3, wherein the active layer comprises a pit extending from an end portion of at least one of the plurality of dislocations of the first nitride semiconductor layer.

5. The light emitting device according to claim 4, wherein the pit is spaced apart from an upper surface of the second nitride semiconductor layer and a lower surface of the first nitride semiconductor layer.

6. The light emitting device according to claim 4, wherein the pit comprises an opened region therein, and a portion of the second nitride semiconductor layer is disposed in the opened region of the pit.

7. The light emitting device according to claim 4, wherein the second nitride semiconductor layer comprises a compound semiconductor layer having a composition formula represented by $In_xGa_{1-x}N$ ($0 < x \leq 1$) comprising second conductivity type impurities.

8. The light emitting device according to claim 1, wherein the second nitride semiconductor layer comprises a compound semiconductor layer having a composition formula represented by $In_xAl_yGa_{1-x-y}N$ ($0 \leq x \leq 1$, $0 < y \leq 1$, $0 \leq x+y \leq 1$).

9. The light emitting device according to claim 1, wherein the active layer comes into contact with at least one of the first nitride semiconductor layer and the second nitride semiconductor layer.

10. The light emitting device according to claim 6, wherein the opened region of the pit is widened from a lower surface of the active layer toward the second nitride semiconductor layer, and the pit comprises a plurality of pits having sidewalls inclined at the same angle.

11. A light emitting device, comprising:
    a first conductivity type semiconductor layer;
    a second conductivity type semiconductor layer;
    an active layer disposed between the first conductivity type semiconductor layer and the second conductivity type semiconductor layer, and comprising a plurality of well layers and a plurality of barrier layers;
    a first nitride semiconductor layer disposed between the first conductivity type semiconductor layer and the active layer; and
    a second nitride semiconductor layer disposed between the active layer and the second conductivity type semiconductor layer,
    wherein the first nitride semiconductor layer comprises an InGaN-based compound semiconductor layer,
    the second nitride semiconductor layer comprises an AlGaN-based compound semiconductor layer,
    the active layer comprises a plurality of pits, and
    an upper surface of the second nitride semiconductor layer is spaced apart from the plurality of pits.

12. The light emitting device according to claim 11, wherein a pit density of the active layer is 1 to $5 \times 10^8$/cm$^2$.

13. The light emitting device according to claim 11, wherein at least one of the plurality of pits extends from an upper surface of the first nitride semiconductor layer.

14. The light emitting device according to claim 13, wherein the first nitride semiconductor layer comprises a plurality of indium clusters, and an indium composition of the indium clusters is higher than that of at least one of the plurality of well layers.

15. The light emitting device according to claim 11, wherein the second nitride semiconductor layer has a thickness greater than that of the first nitride semiconductor layer and a lower surface of the second nitride semiconductor layer has roughness.

16. The light emitting device according to claim 14, wherein the plurality of pits each comprise an opened region, and the opened region comprises at least one of the second nitride semiconductor layer, the well layer and the barrier layer.

17. The light emitting device according to claim 14, wherein the first nitride semiconductor layer comprises a plurality of dislocations therein, and at least one of the plurality of dislocations is connected to one of the plurality of pits.

18. A light emitting device, comprising:
a first conductivity type semiconductor layer;
a second conductivity type semiconductor layer;
an active layer disposed between the first conductivity type semiconductor layer and the second conductivity type semiconductor layer, and comprising a plurality of well layers and a plurality of barrier layers;
a first nitride semiconductor layer disposed between the first conductivity type semiconductor layer and the active layer; and
a second nitride semiconductor layer disposed between the active layer and the second conductivity type semiconductor layer,
wherein the first nitride semiconductor layer has first conductivity type impurities and comprises a semiconductor layer different from the first conductivity type semiconductor layer,
the second nitride semiconductor layer has second conductivity type impurities and comprises a semiconductor layer different from the second conductivity type semiconductor layer,
the active layer comprises a plurality of pits therein, and
the first nitride semiconductor layer comprises a plurality of indium clusters and a plurality of dislocations.

19. The light emitting device according to claim 18, wherein the second nitride semiconductor layer has a thickness ranging from about 5 nm to 15 nm, and the first nitride semiconductor layer has a thickness ranging from about 0.35 nm to 5 nm.

20. The light emitting device according to claim 18, wherein a lower surface of the second nitride semiconductor layer comes into contact with the pit.

* * * * *